(12) United States Patent
Zhu et al.

(10) Patent No.: US 7,829,939 B1
(45) Date of Patent: Nov. 9, 2010

(54) MOSFET INCLUDING EPITAXIAL HALO REGION

(75) Inventors: Huilong Zhu, Poughkeepsie, NY (US); Qingqing Liang, LaGrangeville, NY (US); Jing Wang, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/426,467

(22) Filed: Apr. 20, 2009

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .............. 257/327; 257/336; 257/344; 257/408; 257/900; 257/E29.012; 257/E29.063

(58) Field of Classification Search ............. 257/327, 257/336, 344, 408, 900, E29.012, E29.063
See application file for complete search history.

(56) References Cited

U.S. PATENT DOCUMENTS

| | | |
|---|---|---|
| 5,768,146 A | 6/1998 | Jassowski |
| 5,798,541 A | 8/1998 | Jassowski |
| 5,834,355 A | 11/1998 | Doyle |
| 5,990,941 A | 11/1999 | Jackson et al. |
| 6,020,244 A | 2/2000 | Thompson et al. |
| 6,355,962 B1 * | 3/2002 | Liang et al. ............. 257/369 |
| 6,429,482 B1 * | 8/2002 | Culp et al. ............... 257/345 |
| 6,440,788 B2 * | 8/2002 | Mandelman et al. ..... 438/204 |
| 6,492,670 B1 * | 12/2002 | Yu ........................ 257/284 |
| 6,548,842 B1 | 4/2003 | Bulucea et al. |
| 6,566,204 B1 | 5/2003 | Wang et al. |
| 6,586,294 B1 | 7/2003 | Post et al. |
| 6,599,804 B2 | 7/2003 | Bulucea et al. |
| 6,717,221 B2 | 4/2004 | Post et al. |
| 6,731,284 B1 | 5/2004 | Oxaal |
| 6,743,684 B2 | 6/2004 | Liu |
| 6,795,113 B1 | 9/2004 | Jackson et al. |
| 6,797,576 B1 | 9/2004 | Teng et al. |
| 6,833,307 B1 | 12/2004 | Wristers et al. |
| 6,847,089 B2 * | 1/2005 | Chakravarthi et al. ....... 257/408 |
| 6,979,609 B2 | 12/2005 | Post et al. |
| 7,001,811 B2 | 2/2006 | Keshavarzi et al. |
| 7,064,039 B2 | 6/2006 | Liu |

(Continued)

OTHER PUBLICATIONS

Scansen, D., "Under the Hood: Intel's 45-NM High-K Metal-Gate Process," www.eetimes.com/showArticle.jhtml?articleID=202806020, Nov. 14, 2007, EE Times.

*Primary Examiner*—Ida M Soward
(74) *Attorney, Agent, or Firm*—Scully, Scott, Murphy & Presser, P.C.; H. Daniel Schnurmann

(57) ABSTRACT

A metal oxide semiconductor field effect transistor structure and a method for fabricating the metal oxide semiconductor field effect transistor structure provide for a halo region that is physically separated from a gate dielectric. The structure and the method also provide for a halo region aperture formed horizontally and crystallographically specifically within a channel region pedestal within the metal oxide semiconductor field effect transistor structure. The halo region aperture is filled with a halo region formed using an epitaxial method, thus the halo region may be formed physically separated from the gate dielectric. As a result, performance of the metal oxide semiconductor field effect transistor is enhanced.

15 Claims, 6 Drawing Sheets

U.S. PATENT DOCUMENTS

| | | |
|---|---|---|
| 7,145,191 B1 | 12/2006 | Teng et al. |
| 7,177,176 B2 | 2/2007 | Zheng et al. |
| 7,226,843 B2 | 6/2007 | Weber et al. |
| 7,355,246 B2 | 4/2008 | Keshavarzi et al. |
| 7,410,876 B1* | 8/2008 | Min et al. ................ 438/301 |
| 2002/0149058 A1* | 10/2002 | Culp et al. ............... 257/354 |
| 2003/0209758 A1* | 11/2003 | Lee et al. ................. 257/336 |
| 2006/0033152 A1* | 2/2006 | Kim et al. ................ 257/321 |
| 2006/0121681 A1* | 6/2006 | Nandakumar ............ 438/302 |
| 2006/0124993 A1* | 6/2006 | Zhu et al. ................ 257/328 |
| 2007/0029608 A1* | 2/2007 | Huang ..................... 257/327 |
| 2007/0158763 A1* | 7/2007 | Anderson et al. ........ 257/401 |
| 2007/0194392 A1* | 8/2007 | Travis et al. ............. 257/394 |
| 2008/0061340 A1* | 3/2008 | Heineck et al. .......... 257/301 |
| 2008/0121992 A1* | 5/2008 | Yi et al. ................... 257/336 |
| 2008/0290409 A1* | 11/2008 | Dokumaci et al. ....... 257/336 |
| 2008/0290412 A1* | 11/2008 | Wang et al. .............. 257/344 |
| 2008/0305590 A1* | 12/2008 | Wang et al. .............. 438/217 |
| 2009/0035912 A1* | 2/2009 | Yun ......................... 438/305 |
| 2009/0053880 A1* | 2/2009 | Manabe ................... 438/524 |
| 2009/0152646 A1* | 6/2009 | Zhu et al. ................ 257/408 |
| 2009/0152647 A1* | 6/2009 | Jung et al. ............... 257/408 |
| 2009/0186457 A1* | 7/2009 | Lee et al. ................. 438/231 |
| 2010/0047985 A1* | 2/2010 | Dakshina Murthy et al. ....................... 438/303 |
| 2010/0096680 A1* | 4/2010 | Mouli et al. ............. 257/296 |

* cited by examiner

MOSFET INCLUDING EPITAXIAL HALO REGION

BACKGROUND

1. Field of the Invention

The invention relates generally to metal oxide semiconductor field effect transistor (MOSFET) structures, and methods for fabrication thereof. More particularly, the invention relates to metal oxide semiconductor field effect transistor structures that include well defined halo regions, and methods for fabrication thereof.

2. Description of the Related Art

Semiconductor structures include semiconductor substrates within and upon which are formed semiconductor devices, such as but not limited to resistors, transistors, diodes and capacitors. The semiconductor devices are connected and interconnected using patterned conductor layers that are separated by dielectric layers. A particularly common semiconductor device that is used for fabricating semiconductor structures is a metal oxide semiconductor field effect transistor. Such a metal oxide semiconductor field effect transistor comprises a gate located and formed over a gate dielectric that in turn is located and formed over a channel region within a semiconductor substrate that separates a plurality of source and drain regions within the semiconductor substrate. Metal oxide semiconductor field effect transistors have been successfully scaled in dimension over the period of several decades to provide semiconductor circuits with continuously enhanced functionality and continuously enhanced performance.

A particular structural element that is desirable within a metal oxide semiconductor field effect transistor is a halo region of different, and typically opposite, polarity of the source region and the drain region (which hereinafter will be referred to as source and drain regions). Such a halo region, that is located interposed between the source and drain regions and the channel region, is intended to provide enhanced channel isolation within a metal oxide semiconductor field effect transistor. Unfortunately, since halo regions are typically formed using a large angle tilt ion implantation method when a gate and gate dielectric are in place and used as an ion implantation mask, halo region implantation ions routinely compromise performance of field effect transistor devices insofar as halo region implantation ions provide undesirable residual halo region implantation atoms physically at or near a gate dielectric.

Thus, desirable within the semiconductor fabrication art are metal oxide semiconductor field effect transistor structures that include well defined halo regions that are physically separated from gate dielectrics.

SUMMARY

The invention provides a metal oxide semiconductor field effect transistor structure that includes a well defined halo region that is physically separated from a gate dielectric, and a method for fabricating the metal oxide semiconductor field effect transistor structure that includes the well defined halo region that is physically separated from the gate dielectric. The particular metal oxide semiconductor field effect transistor structure and method in accordance with the invention are predicated upon a halo region within a metal oxide semiconductor field effect transistor that is grown as an epitaxial halo region rather than formed as an ion implanted halo region. By growing the halo region as the epitaxial halo region rather than implanting the halo region as the implanted halo region, the halo region may be formed with better defined boundaries that include well defined boundaries, that in turn are physically separated from a gate dielectric. As a result of the better defined halo region boundaries that comprise well defined boundaries that are physically separated from the gate dielectric, the metal oxide semiconductor field effect transistor may be fabricated to provide enhanced performance within the context of improved carrier mobility.

Within the context of the embodiment and the invention, "well defined" boundaries of an epitaxial halo region in comparison with an implanted halo region are intended as boundaries that are sufficiently contained so that halo dopant atoms are not present within a distance less than 5 nanometers from a gate dielectric. Preferably, such halo atoms are located at a distance at least 15 nanometers, and preferably from 5 to 15 nanometers from the gate dielectric.

A particular metal oxide semiconductor field effect transistor structure in accordance with the invention includes a gate located over a gate dielectric. The gate dielectric in turn is located over a channel region within a semiconductor substrate that separates a plurality of source and drain regions within the semiconductor substrate. This particular metal oxide semiconductor field effect transistor structure also includes at least one halo region located at least in-part beneath the channel region and physically separated from the gate dielectric.

A particular method for fabricating a metal oxide semiconductor field effect transistor in accordance with the invention includes forming a gate over a gate dielectric. The gate dielectric in turn is formed over a channel region within a semiconductor substrate that separates a plurality of source and drain regions within the semiconductor substrate. This particular method also includes forming at least one halo region located at least in-part beneath the channel region and physically separated from the gate dielectric.

Another particular method for fabricating a metal oxide semiconductor field effect transistor in accordance with the invention includes forming a gate over a gate dielectric. The gate dielectric in turn is formed over a semiconductor substrate. This other particular method also includes etching vertically the semiconductor substrate while using at least in-part the gate as a mask, to form a channel region pedestal within the semiconductor substrate. This other particular method also includes etching horizontally and crystallographically specifically the channel region pedestal to provide at least one halo region aperture within the channel region pedestal that is defined at least in-part by a crystallographic plane of the semiconductor substrate. The at least one halo region aperture is physically separated from the gate dielectric. This other particular method also includes forming at least in-part horizontally epitaxially a halo region into the halo region aperture.

BRIEF DESCRIPTION OF THE DRAWINGS

The objects, features and advantages of the invention are understood within the context of the Description of the Preferred Embodiment, a set forth below. The Description of the Preferred Embodiment is understood within the context of the accompanying drawings, that form a material part of this disclosure wherein.

DESCRIPTION OF THE PREFERRED EMBODIMENT

The invention, which includes a particular metal oxide semiconductor field effect transistor structure and a particular method for fabricating the particular metal oxide semiconductor field effect transistor structure, is understood within the context of the description set forth below. The description set forth below is understood within the context of the drawings described above. Since the drawings are intended for illustrative purposes, the drawings are not necessarily drawn to scale.

Figure 1:
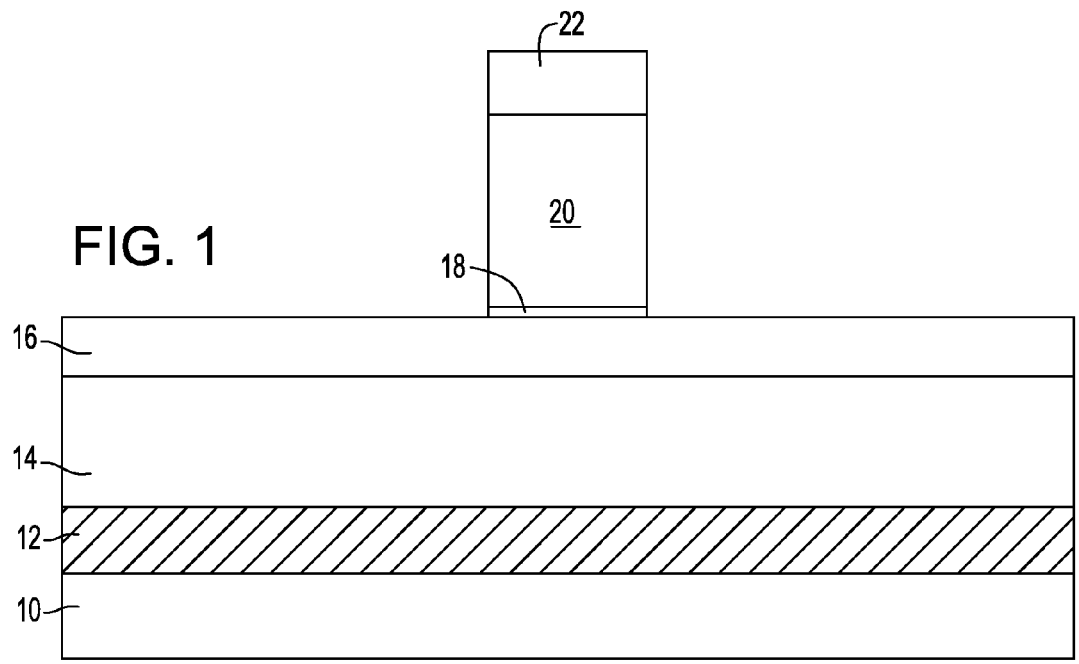
FIG. 1 is a schematic cross-sectional diagram illustrating an initial structure that can be employed in the present invention after gate formation.

FIG. 1 to FIG. 9 show a series of schematic cross-sectional diagrams illustrating the results of progressive stages in fabricating a metal oxide semiconductor field effect transistor structure in accordance with a particular embodiment of the invention. This particular embodiment of the invention comprises a sole embodiment of the invention. FIG. 1 shows a schematic cross-sectional diagram of the metal oxide semiconductor field effect transistor structure at an early stage in the fabrication thereof in accordance with this particular sole embodiment of the invention.

FIG. 1 shows a semiconductor structure that includes, in-part: (1) a first semiconductor layer 10 (i.e. which may comprise a bulk semiconductor substrate); (2) a second semiconductor layer 12 located and formed upon the first semiconductor layer 10; (3) a third semiconductor layer 14 located and formed upon the second semiconductor layer 12; and (4) a fourth semiconductor layer 16 located and formed upon the third semiconductor layer 14.

Within the schematic cross-sectional diagram of FIG. 1, and in accordance with this particular embodiment, adjoining semiconductor layers within the first semiconductor layer 10, the second semiconductor layer 12, the third semiconductor layer 14 and the fourth semiconductor layer 16 comprise different semiconductor materials that have different etch characteristics. Thus, typically and preferably, and while not limiting the embodiment or the invention: (1) the first semiconductor layer 10 and the third semiconductor layer 14 comprise a first semiconductor material; and (2) the second semiconductor layer 12 and the fourth semiconductor layer 16 comprise a second semiconductor material that is different than the first semiconductor material. The foregoing designations and selections do not, however, limit the embodiment or the invention.

Each of the first semiconductor material and the second semiconductor material may comprise any of several semiconductor materials. Non-limiting examples of candidate semiconductor materials for each of the first semiconductor material and the second semiconductor material include silicon, germanium, silicon-germanium alloy, silicon-carbon alloy, silicon-germanium-carbon alloy and compound (i.e., III-V and II-VI) semiconductor materials. Non-limiting examples of compound semiconductor materials include gallium arsenide, indium arsenide and indium phosphide semiconductor materials.

Typically, and for exemplary purposes, the first semiconductor layer 10 comprises a silicon semiconductor material that has a thickness from 0.05 to 750 micrometers and the third semiconductor layer 14 comprises the same silicon semiconductor material that has a thickness from 20 to 50 nanometers. Typically, and also for exemplary purposes, the second semiconductor layer 12 comprises a silicon-germanium alloy semiconductor material that has a germanium content from 2 to 5 atomic percent and a thickness from 5 to 10 nanometers, and the fourth semiconductor layer 16 comprises a silicon-germanium alloy semiconductor material that also has the germanium content from 2 to 15 atomic percent and a thickness from 5 to 10 nanometers. The foregoing semiconductor materials selections are intended as illustrative of the invention rather than limiting of the invention. Alternative semiconductor materials selections, including but not limited to reversed semiconductor materials selections, are also plausible and not precluded within the embodiment and the invention.

As is also understood by a person skilled in the art, each of the first semiconductor layer 10, the second semiconductor layer 12, the third semiconductor layer 14 and the fourth semiconductor layer 16 comprises a dopant of polarity and concentration appropriate to a metal oxide semiconductor field effect transistor desired to be fabricated incident to further processing of the semiconductor structure whose schematic cross-sectional diagram is illustrated in FIG. 1.

Similarly, although the particular embodiment of the invention that is illustrated in FIG. 1 illustrates the invention within the context of a nominally bulk semiconductor substrate that includes, in a sequentially layered and stacked fashion: (1) the first semiconductor layer 10; (2) the second semiconductor layer 12 located and formed upon the first semiconductor layer 10; (3) the third semiconductor layer 14 located and formed upon the second semiconductor layer; and (4) the fourth semiconductor layer 16 located and formed upon the third semiconductor layer 14, neither this particular embodiment, nor the invention in general, is necessarily intended to be so limited. Rather, the particular embodiment, as well as the invention, may also be practiced using a semiconductor-on-insulator substrate that includes, in-part, a base semiconductor substrate separated from a surface semiconductor layer by a buried dielectric layer. Alternatively, the particular embodiment, as well as the invention, may also be practiced using a hybrid orientation substrate that includes multiple semiconductor material layers of different crystallographic orientation supported upon a single substrate.

Semiconductor-on-insulator substrates and hybrid orientation substrates may be fabricated using any of several methods, including but not limited to layer laminating methods, layer transfer methods and separation by implantation of oxygen (SIMOX) methods. In contrast, the nominally bulk semiconductor substrate within the semiconductor structure that is illustrated in FIG. 1 is typically, although not necessarily exclusively, fabricated using a sequential epitaxial deposition method.

FIG. 1 also shows: (1) a gate dielectric 18 located and formed upon the fourth semiconductor layer 16; (2) a gate 20 located and formed upon the gate dielectric 18; and (3) a capping layer 22 located and formed upon the gate 20. Each of the foregoing layers and structures may comprise materials and have dimensions that are conventional in the semiconductor fabrication art. Each of the foregoing layers and structures may also be formed using methods that are conventional in the semiconductor fabrication art.

The gate dielectric 18 may comprise conventional dielectric materials such as oxides, nitrides and oxynitrides of silicon that have a dielectric constant from about 4 to about 20, measured in vacuum. Alternatively, the gate dielectric 18 may comprise generally higher dielectric constant gate dielectric materials having a dielectric constant from about 20 to at least about 100. Such generally higher dielectric constant dielectric materials may include, but are not limited to hafnium oxides, hafnium silicates, titanium oxides, barium-strontium-titantates (BSTs) and lead-zirconate-titanates (PZTs).

The gate dielectric 18 may be formed using any of several methods that are appropriate to its material of composition. Included, but not limiting, are thermal or plasma oxidation or nitridation methods, chemical vapor deposition methods and physical vapor deposition methods. Typically, the gate dielectric 18 comprises a thermal silicon oxide dielectric material that has a thickness from 0.5 to 2 nanometers or a higher dielectric constant dielectric material, that has a thickness from 1 to 3 nanometers.

The gate 20 may comprise gate conductor materials including, but not limited to, certain metals, metal alloys, metal nitrides and metal silicides, as well as laminates thereof and composites thereof. The gate 20 may also comprise doped polysilicon and doped polysilicon-germanium alloy materials (i.e., having a dopant concentration from about 1e18 to about 1e22 dopant atoms per cubic centimeter) and polycide materials (doped polysilicon/metal silicide stack materials). Similarly, the foregoing materials may also be formed using any of several methods. Non-limiting examples include salicide methods, chemical vapor deposition methods and physical vapor deposition methods, such as, but not limited to evaporative methods and sputtering methods. Typically, the gate 20 comprises a doped polysilicon material or a metal gate material that has a thickness from about 200 to about 1500 angstroms.

The capping layer 22, which may be optional in some embodiments of the invention, may comprise any of several capping materials that will generally comprise hard mask materials. Dielectric capping materials are most common, but are also not limiting. The dielectric capping materials may include, but are not limited to oxides, nitrides and oxynitrides of silicon, but oxides, nitrides and oxynitrides of other elements are not excluded. The dielectric capping materials may be formed using any of the several methods that may be used for forming the gate dielectric 18. Typically, the capping layer 22 comprises a silicon nitride dielectric capping material that has a thickness from 10 to 50 nanometers.

Figure 2:
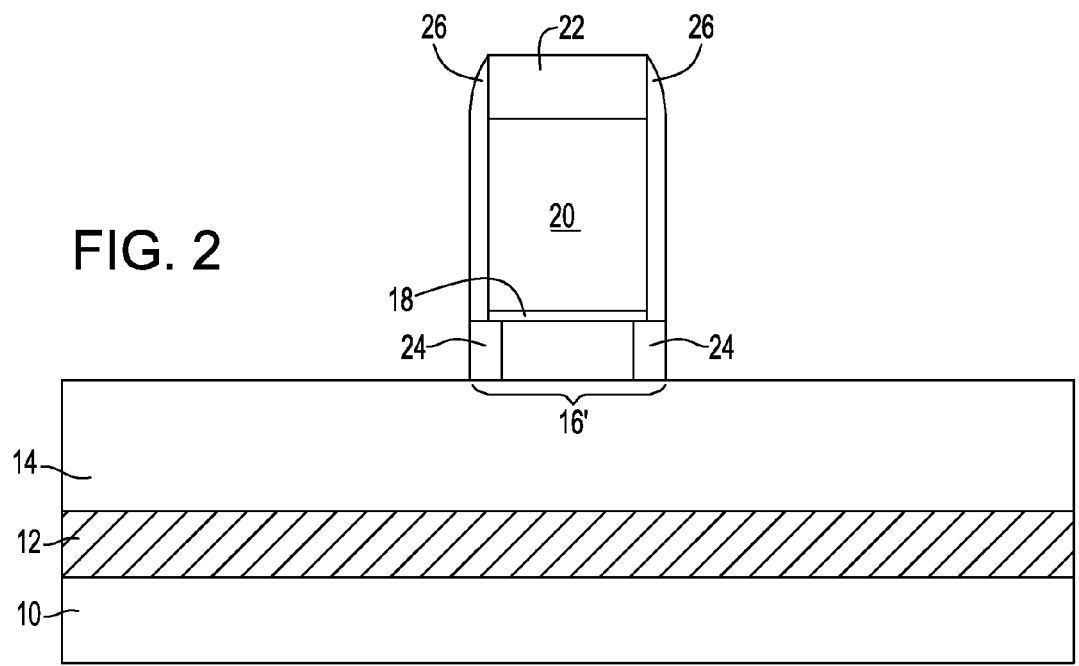
FIG. 2 is a schematic cross-sectional diagram illustrating the structure of FIG. 1 after extension region, channel region and first spacer formation.

FIG. 2 shows a first spacer 26 located and formed adjacent and adjoining the sidewalls of the gate dielectric 18, the gate 20 and the capping layer 22. The first spacer 26 is typically and preferably formed of a dielectric material selected from the same group of dielectric materials as the capping layer 22, and to that end, the first spacer 26 and the capping layer 22 are desirably formed of the same dielectric material, which as noted above is typically a silicon nitride dielectric material. As is understood by a person skilled in the art, the first spacer 26 (which although illustrated as plural layers in FIG. 2 is intended as a single layer surrounding the capping layer 22, the gate 20 and the gate dielectric 18 in plan-view) is typically formed using a blanket layer deposition and anisotropic etchback method.

FIG. 2 also shows a fourth semiconductor layer 16' that results from patterning of the fourth semiconductor layer 16 that is illustrated in FIG. 1, while using the gate dielectric 18, the gate 20, the capping layer 22 and the first spacer 26 as a mask. Finally, FIG. 2 also shows a plurality of extension regions 24 located and formed at opposite ends of the fourth semiconductor layer 16'.

To fabricate the semiconductor structure of FIG. 2 from the semiconductor structure of FIG. 1, and prior to forming the first spacer 26 and patterning the fourth semiconductor layer 16 to form the fourth semiconductor layer 16' as described above, the exposed portions of the fourth semiconductor layer 16 are implanted to form elongated extension regions that include the extension regions 24. When forming such elongated extension regions that include the extension regions 24, the fourth semiconductor layer 16 is implanted with a dopant of polarity appropriate to a polarity of a metal oxide semiconductor field effect transistor desired to be fabricated incident to further processing of the semiconductor structure of FIG. 2. Such an appropriate dopant concentration in the extension regions 24 typically ranges from $10^{19}$ to $10^{20}$ dopant atoms per cubic centimeter.

Subsequent to forming the elongated extension regions that include the extension regions 24, the first spacer 26 is formed using a blanket layer deposition and etchback method that (as noted above) will typically and preferably provide the first spacer 26 of the same dielectric material as the capping layer 22. Finally, the fourth semiconductor layer 16 that includes the elongated extension regions that further include the extension regions 24 that in turn are separated by a channel region located beneath the gate 20, is patterned to form the fourth semiconductor layer 16'. Such patterning is typically effected using an anisotropic plasma etch method that uses the gate dielectric 18, the gate 20, the capping layer 22 and the first spacer 26 as a mask.

Figure 3:
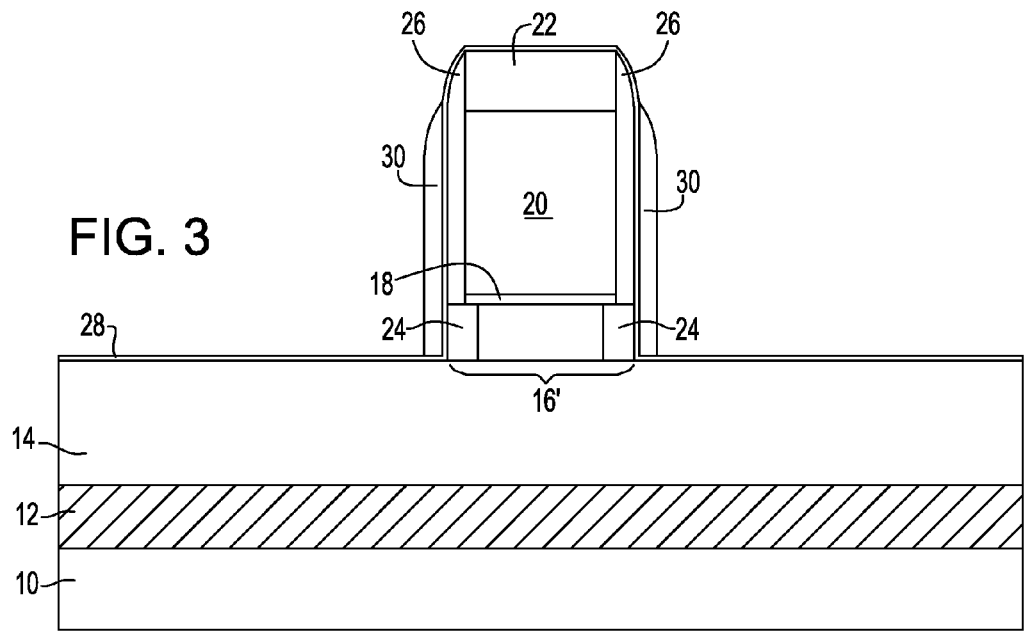
FIG. 3 is a schematic cross-sectional diagram illustrating the structure of FIG. 2 after second spacer formation.

FIG. 3 first shows a conformal etch stop layer 28 located and formed upon the semiconductor structure of FIG. 2, including exposed surfaces of the third semiconductor layer 14, the fourth semiconductor layer 16', the first spacer 26 and the capping layer 22. The conformal etch stop layer 28 may comprise any of several etch stop materials, including but not limited to conductor etch stop materials, dielectric etch stop materials and semiconductor etch stop materials. Typically, the conformal etch stop layer comprises a dielectric etch stop material selected from the same group of dielectric materials that may be used for forming the spacer 26 and the capping layer 22. However, for etch selectivity and etch stop purposes, the conformal etch stop layer 28 comprises a different dielectric material in comparison with the first spacer 26 and the capping layer 22. Typically, but not necessarily exclusively, the conformal etch stop layer 28 comprises a silicon oxide material that has a thickness from 3 to 15 nanometers, when the first spacer 26 and the capping layer 22 comprise a silicon nitride material.

FIG. 3 also shows a second spacer 30 located and formed upon the conformal etch stop layer 28 at a location adjacent the first spacer 26 and the extension regions 24. The second spacer 30 typically comprises the same material, such as but not limited to a silicon nitride dielectric material, that is used for forming the first spacer 26. The second spacer 30 is typically also formed using the same blanket layer deposition and anisotropic etchback method that is used for forming the first spacer 26. Alternative methods and materials may also be used for forming the second spacer 26 provided that such alternative materials allow for adequate etch selectivity within the context of the material from which is comprised the conformal etch stop layer 28.

Figure 4:
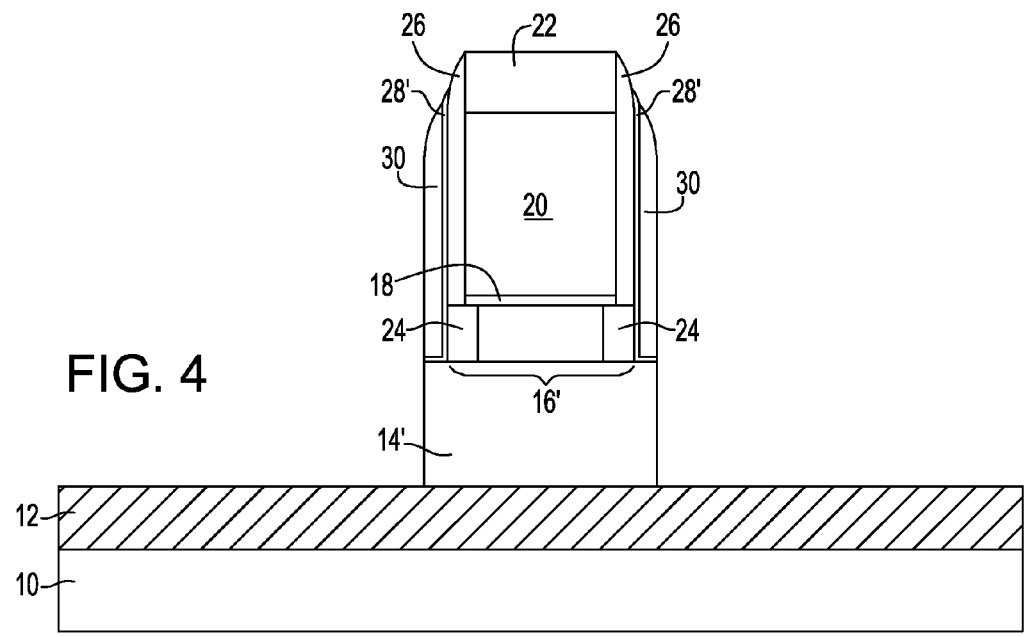
FIG. 4 is a schematic cross-sectional diagram illustrating the structure of FIG. 3 after vertical semiconductor substrate etching.

FIG. 4 shows the results of vertically etching the conformal etch stop layer 28 and the third semiconductor layer 14 to provide a conformal etch stop layer 28' and a third semiconductor layer 14', while using the second spacer 30, the conformal etch stop layer 28', the first spacer 26, the capping layer 22, the gate 20, the gate dielectric 18 and the fourth semiconductor layer 16' as a mask.

The foregoing etching of the conformal etch stop layer 28 and the third semiconductor layer 14 to provide the conformal etch stop layer 28' and the third semiconductor layer 14' may be effected using methods and materials that are otherwise generally conventional in the semiconductor fabrication art. Included in particular, but also not limiting, are wet chemical etch methods and materials, and dry plasma etch methods and materials. In accordance with disclosure above, anisotropic dry plasma etch methods and materials are generally preferred insofar as anisotropic dry plasma etch methods and materials generally provide straight sidewalls when forming patterned layers.

Within the context of the invention as claimed, the third semiconductor layer 14', in conjunction with and with respect to the channel portion of the fourth semiconductor layer 16', may be considered as a channel pedestal.

Figure 5:
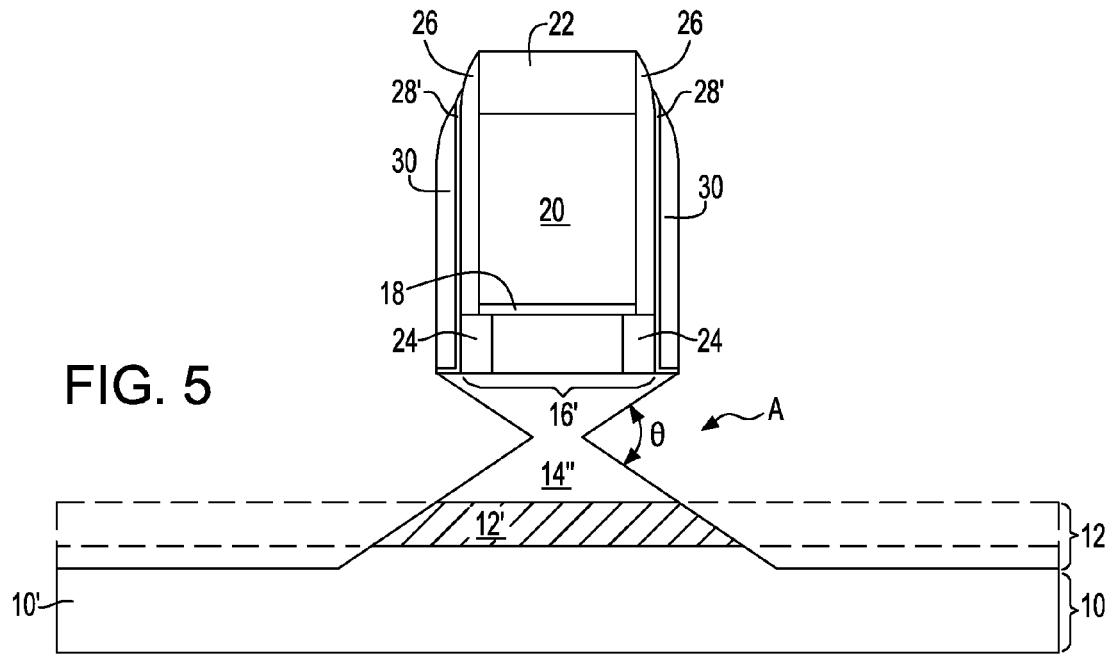
FIG. 5 is a schematic cross-sectional diagram illustrating the structure of FIG. 4 after horizontal crystallographically specific semiconductor substrate etching.

FIG. 5 shows the results of a horizontally directionally specifically and crystallographically specifically etching the third semiconductor layer 14', as well as a vertically crystallographically specifically etching the second semiconductor layer 12 and the first semiconductor layer 10, to provide: (1) a corresponding third semiconductor layer 14" located and formed primarily beneath the fourth semiconductor layer 16'; as well as (2) a second semiconductor layer 12' located and formed beneath the third semiconductor layer 14"; and (3) a first semiconductor layer 10' located and formed beneath the second semiconductor layer 12'.

The foregoing etching of the third semiconductor layer 14', the second semiconductor layer 12 and the first semiconductor layer 10 may be effected, for example and without limitation, when the first semiconductor layer 10 and the third semiconductor layer 14 comprise a silicon semiconductor material and the second semiconductor layer 12 comprises a silicon-germanium alloy semiconductor material, while using an etchant such as but not limited to an aqueous potassium hydroxide, ethylenediamine pyrocatechol (EDP) or tetramethylammonium hydroxide (TMAH) directionally and crystallographically specific etchant. In particular, silicon is etched directionally (i.e., anisotropically) and crystallographically specifically in the foregoing etchants. These particular alkaline solution etchants are convenient and highly selective etchants for silicon, where a silicon etching reaction proceeds in a <100> or a <110> crystallographic direction, but stops when an etch front reaches a {111} plane. As is illustrated in phantom within the schematic cross-sectional diagram of FIG. 5, when the third semiconductor layer 14' comprises a sufficiently different semiconductor material in comparison with the second semiconductor layer 12, the second semiconductor layer 12 may serve as an etch stop when etching the third semiconductor layer 14' to form the third semiconductor layer 14", and under such circumstances both the second semiconductor layer 12 and the first semiconductor layer 10 are not etched.

Under circumstances where the third semiconductor layer 14/14' comprises a (111) plane silicon semiconductor material or other semiconductor material, the third semiconductor layer 14" when etched with the above described etchant provides a plurality of crystallographic plane defined apertures A (i.e., a plurality of counter-opposed apertures) that has a crystallographic plane defined apex angle θ of 109.4 degrees for a (100) wafer, if a source and drain direction is <110>, 70.6 degrees if a source and drain direction is <100>.

Figure 6:
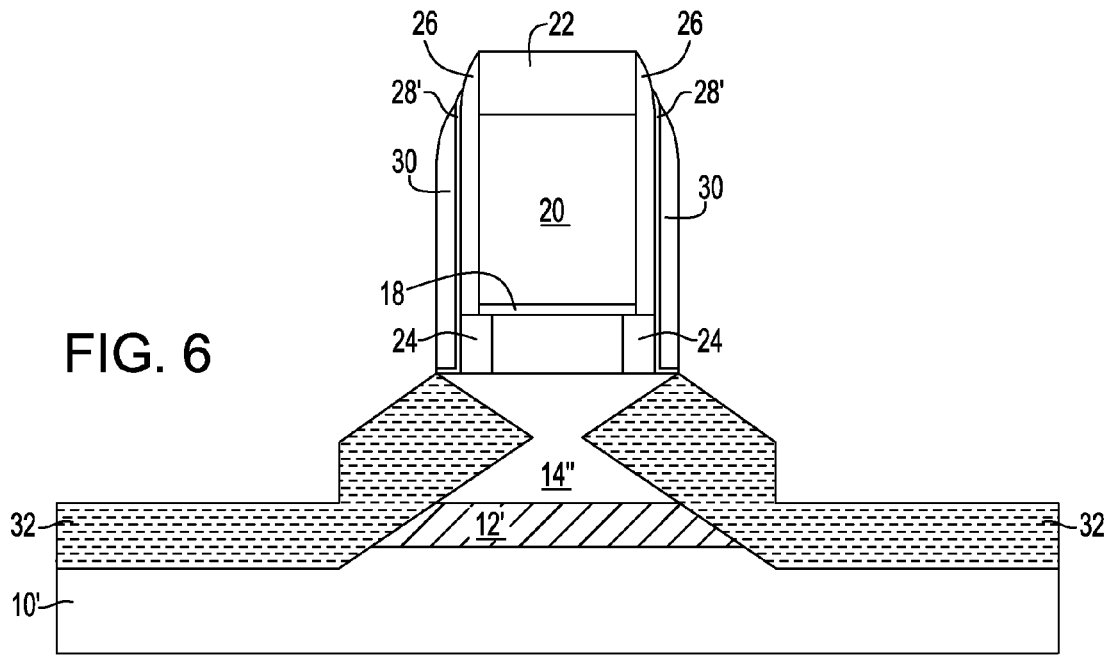
FIG. 6 is a schematic cross-sectional diagram illustrating the structure of FIG. 5 after epitaxial halo layer formation.

FIG. 6 shows the results of forming a plurality of epitaxial halo layers 32 upon exposed surfaces of the first semiconductor layer 10', the second semiconductor layer 12' and the third semiconductor layer 14". The plurality of epitaxial halo layers 32 comprises a semiconductor halo material including a dopant of appropriate polarity and appropriate concentration within the context of the polarity of a metal oxide field effect transistor desired to be fabricated incident to further processing of the semiconductor structure of FIG. 6.

For example, and without limitation, when further processing of the semiconductor structure of FIG. 6 is intended to provide a p-MOSFET, the epitaxial halo layer 32 preferably comprises an n-doped (i.e., such as but not limited to arsenic doped) silicon-germanium alloy material that has an n-dopant concentration from $10^{18}$ to $2\times10^{19}$ n-dopant atoms per cubic centimeter and a germanium content from 1 to 30 atomic percent.

Also for example, and also without limitation, when further processing of the semiconductor structure of FIG. 6 is intended to provide an n-MOSFET, the epitaxial halo layer 32 preferably comprises a p-doped (i.e., such as but not limited to boron doped) silicon-carbon alloy material that has a p-dopant concentration from $10^{18}$ to $2\times10^{19}$ p-dopant atoms per cubic centimeter and a carbon content from 0.5 to 3 atomic percent.

Typically and preferably, the epitaxial halo layer 32 is formed to a thickness from 7 to 20 nanometers, where such a thickness is intended as a sufficient thickness to fill the apertures A within the third semiconductor layer 14" that are illustrated within the schematic cross-sectional diagram of FIG. 5.

Figure 7:
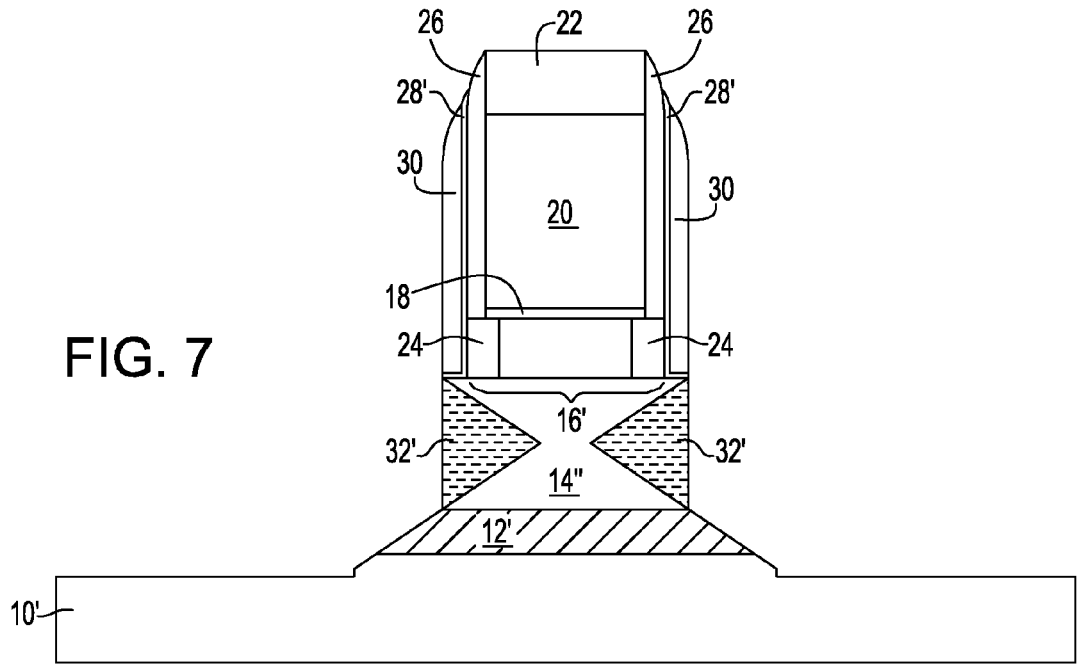
FIG. 7 is a schematic cross-sectional diagram illustrating the structure of FIG. 6 after epitaxial halo region patterning.

FIG. 7 shows the results of etching the epitaxial halo layers 32 that are illustrated within the schematic cross-sectional diagram of FIG. 6 to provide a plurality of epitaxial halo regions 32' that completely fill and are limited to the dimensions of the apertures A that are located and formed within the third semiconductor layer 14", as illustrated in FIG. 5. As is illustrated within the schematic cross-sectional diagram of FIG. 7, the epitaxial halo regions 32' do not extend beyond the outer edges of the second spacer 30, which in turn serves in part as a mask when forming the epitaxial halo regions 32'. The epitaxial halo layers 32 that are illustrated in FIG. 6 may be etched to provide the epitaxial halo regions 32' that are illustrated in FIG. 7 while using etch methods and etch materials that are otherwise generally conventional in the semiconductor fabrication art. Included in particular, but also not generally limiting, are wet chemical etch methods and materials, dry plasma etch methods and materials, and combinations of wet chemical etch methods and materials and dry plasma etch methods and materials. As is noted above, anisotropic dry plasma etch methods and materials are generally preferred when etching the epitaxial halo layers 32 to provide the epitaxial halo regions 32', insofar as dry plasma etch methods and materials typically provide straighter sidewalls to etched layers, in comparison with wet chemical etch methods and materials. Thus, as is illustrated within the schematic cross-sectional diagram of FIG. 7, the epitaxial halo layers 32 that are illustrated in FIG. 6 are typically etched to provide the epitaxial halo regions 32' that are illustrated in FIG. 7 while using dry plasma etch methods and materials.

Figure 8:
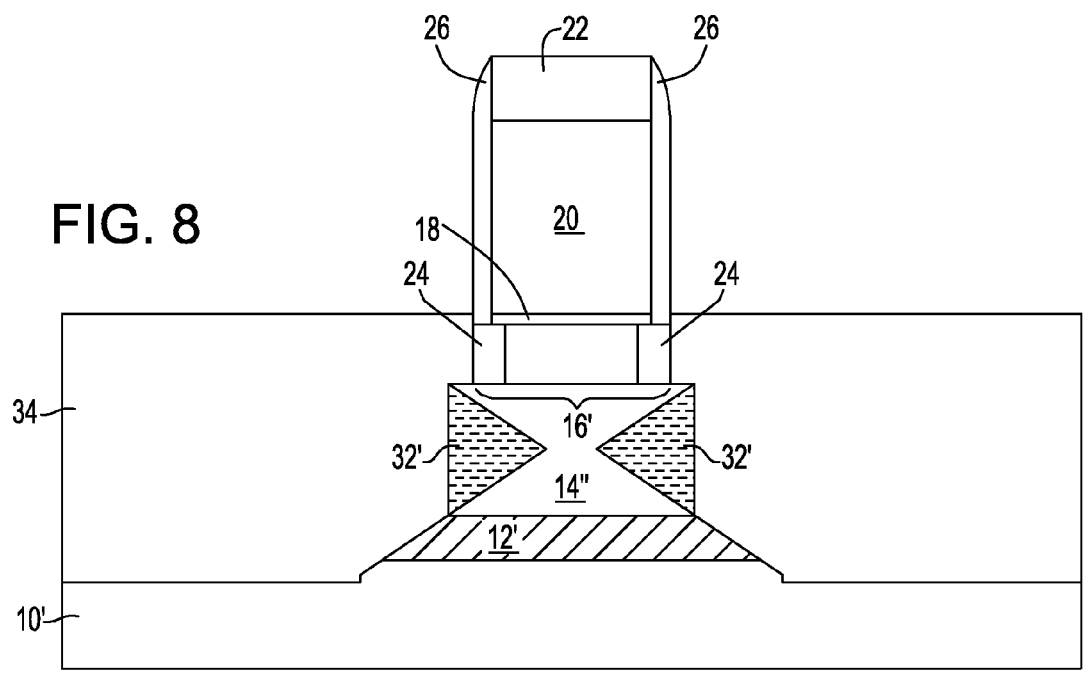
FIG. 8 is a schematic cross-sectional diagram illustrating the structure of FIG. 7 after epitaxial source and drain layer backfill.

FIG. 8 first shows the results of stripping the second spacer 30 and the conformal etch stop layer 28' from the semiconductor structure of FIG. 7. The second spacer 30 and the conformal etch stop layer 28' may typically be stripped from the semiconductor structure of FIG. 7 to provide in-part the semiconductor structure of FIG. 8 while using stripping methods and stripping materials that are otherwise generally conventional in the semiconductor fabrication art. Included in particular, but generally not limiting, are wet chemical etch methods and materials and dry plasma etch methods and materials. Typically and preferably, the second spacer 30 when comprising a silicon nitride material may be stripped selectively with respect to the conformal etch stop layer 28' while using an aqueous phosphoric acid etchant, at elevated temperature. Under such circumstances, a portion of the capping layer 22, if also comprised of a silicon nitride material, may also be etched.

Typically and preferably, the conformal etch stop layer 28' when comprising a silicon oxide material may be stripped selectively with respect to the first spacer 26 and the capping layer 22 when comprising a nitride material, by using an aqueous hydrofluoric acid etchant at elevated temperature.

FIG. 8 also shows a plurality of epitaxial source and drain layers 34 located and formed upon exposed surfaces of the first semiconductor layer 10', the second semiconductor layer 12', the epitaxial halo regions 32' and the extension region 24 portions of the fourth semiconductor layer 16'. In conjunction with the plurality of extension regions 24, the plurality of source and drain layers 34 provide source and drain regions within the metal oxide semiconductor field effect transistor whose schematic cross-sectional diagram is illustrated in FIG. 8.

The epitaxial source and drain layers 34 may be formed using epitaxial methods and materials that are otherwise generally conventional in the semiconductor fabrication art.

While by no means intending to limit the embodiment or the invention, under circumstances where the metal oxide semiconductor field effect transistor structure whose schematic cross-sectional diagram is illustrated in FIG. 8 is intended as a p-MOSFET, the epitaxial source and drain layers 34 may beneficially comprise a p-doped (i.e., boron doped) silicon-germanium alloy semiconductor material that has a p-dopant concentration from $10^{20}$ to $10^{21}$ p-dopant atoms per cubic centimeter and a germanium content from 15 to 35 atomic percent.

In addition, under circumstances where the metal oxide semiconductor field effect transistor structure whose schematic cross-sectional diagram is illustrated in FIG. 8 is intended as an n-MOSFET, the epitaxial source and drain layers 34 may comprise an n-doped (i.e., such as a phosphorus doped) silicon-carbon alloy material having an n-dopant concentration from $10^{20}$ to $10^{21}$ atoms per cubic centimeter and a carbon content from 0.5 to 3 atomic percent.

Figure 9:
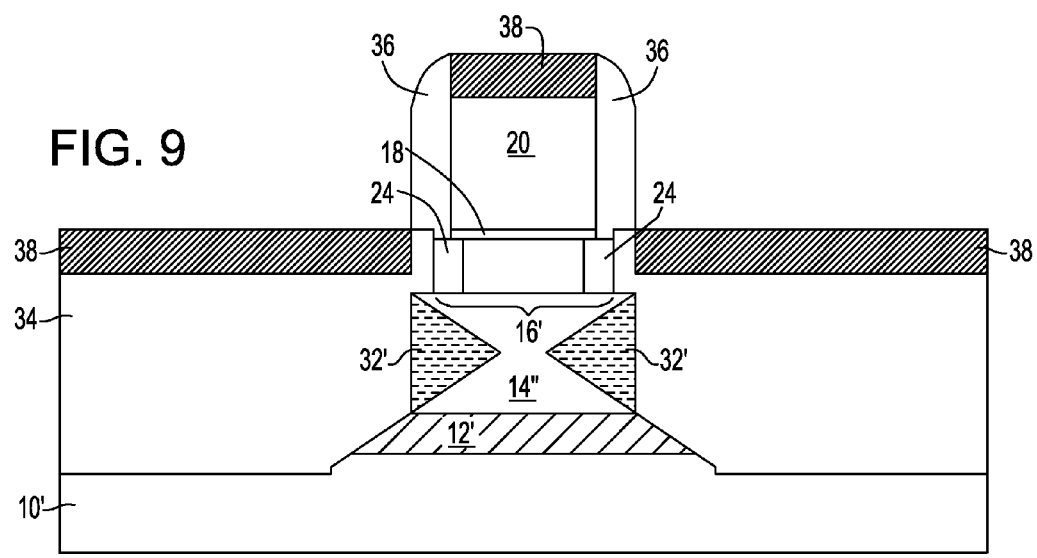
FIG. 9 is a schematic cross-sectional diagram illustrating the structure of FIG. 8 after silicide layer formation.

FIG. 9 first shows the results of stripping the first spacer 26 and the capping layer 22 from the gate 20 within the metal oxide semiconductor field effect transistor structure of FIG. 8. The first spacer 26 and the capping layer 22 may be stripped from the gate 20 within the metal oxide semiconductor field effect transistor structure of FIG. 8 to provide in-part the metal oxide semiconductor field effect transistor structure of FIG. 9 while using stripping methods and stripping materials that are otherwise generally conventional in the semiconductor fabrication art. Included in particular, but also not limiting are wet chemical stripping methods and stripping materials and dry plasma stripping methods and materials.

FIG. 9 also shows a third spacer 36 located and formed adjacent and adjoining sidewalls of the gate dielectric 18 and the gate 20. The third spacer 36 may be formed using methods and materials analogous, equivalent or identical to the methods and materials that are used for forming the first spacer 26 that is illustrated in FIG. 2 or the second spacer 30 that is illustrated in FIG. 3. Thus, the third spacer 36 will typically also comprise a silicon nitride material, although this particular embodiment is not intended to be so limited.

FIG. 9 further shows a plurality of silicide layers 38 located and formed upon exposed portions of the gate 20 and the epitaxial source and drain layers 34. The silicide layer 38 that is located and formed upon the gate 20 is only formed when the gate 20 comprises a silicon containing material, such as but not limited to polysilicon or polysilicon-germanium alloy material. The silicide layers 38 may comprise any of several silicide forming metals. Non-limiting examples of candidate silicide forming metals include nickel, cobalt, titanium, tungsten, erbium, ytterbium, platinum and vanadium silicide forming metals. Nickel and cobalt silicide forming metals are particularly common. Others of the above enumerated silicide forming metals are less common. Typically, the silicide layers 38 are formed using a salicide method.

The salicide method includes: (1) forming a blanket silicide forming metal layer upon the semiconductor structure of FIG. 8 after having stripped therefrom the first spacer 26 and the capping layer 22, and formed the third spacer 36; (2) thermally annealing the blanket silicide forming metal layer with silicon surfaces which it contacts to selectively form the silicide layers 38 while leaving unreacted metal silicide forming metal layers on, for example, the third spacer 36; and (3) selectively stripping unreacted portions of the silicide forming metal layers from, for example, the third spacer 36.

Typically, the silicide layers 38 comprise a nickel silicide material or a cobalt silicide material that has a thickness from about 10 to about 50 nanometers, although this particular illustrative embodiment is not intended to be so limited. In addition, the silicide layers 38 may comprise different silicide material for p-MOSFET devices and n-MOSFET devices, or alternatively source regions and drain regions with respect to gates, although such is also not intended as a limitation of the embodiment or of the invention.

FIG. 9 shows a schematic cross-sectional diagram of a metal oxide semiconductor field effect transistor structure in accordance with a particular embodiment of the invention that comprises a sole embodiment of the invention.

The metal oxide semiconductor field effect transistor structure whose schematic cross-sectional diagram is illustrated in FIG. 9 provides enhanced performance, by including the halo regions 32' that by the nature of epitaxial deposition fabrication thereof clearly have well defined boundaries that are clearly separated from the gate dielectric 18 within the metal oxide semiconductor field effect transistor. Such clear separation of the epitaxial halo regions 32' from the gate dielectric 18 provides for enhanced performance of the metal oxide semiconductor field effect transistor whose schematic cross-sectional diagram is illustrated in FIG. 9.

In addition, although the schematic cross-sectional diagram of FIG. 9 illustrates the epitaxial halo regions 32' as formed as triangular regions with horizontally counter-opposed apices, upon thermal annealing to provide dopant activation of the epitaxial halo regions 32', the junction boundaries of the epitaxial halo regions 32' are expected to diffuse interposed between the horizontally counter-opposed apices and connect under certain separation distances and thermal annealing conditions, to form a single bow-tie shaped epitaxial halo region.

Figure 11:
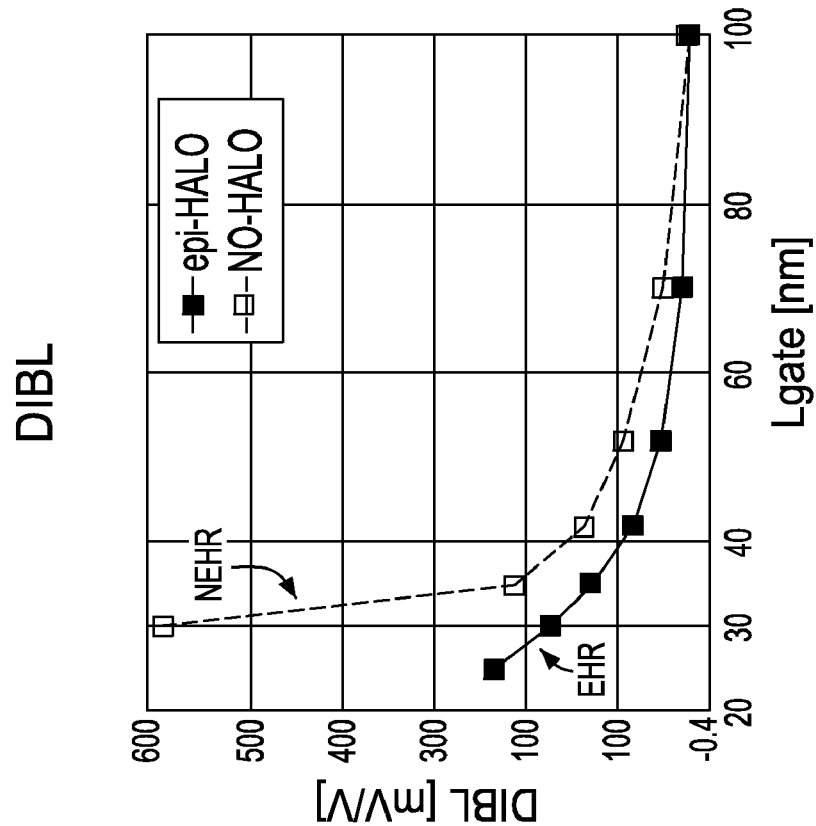
FIG. 11 shows a graph illustrating the results of drain induced barrier lowering performance of a metal oxide semiconductor field effect transistors fabricated in accordance with the invention (i.e., using an epitaxial halo region) in comparison with a metal oxide semiconductor field effect transistor not fabricated in accordance with the invention (i.e., using a conventional ion implanted halo region).
Figure 10:
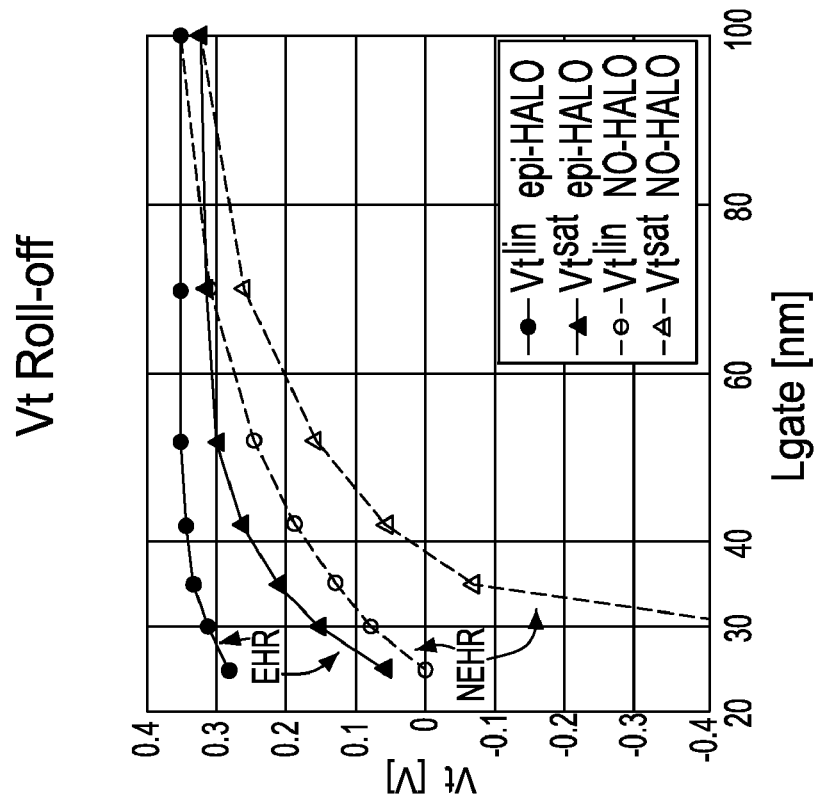
FIG. 10 shows a graph illustrating the results of threshold voltage roll-off performance of a metal oxide semiconductor field effect transistors fabricated in accordance with the invention (i.e., using an epitaxial halo region) in comparison with a metal oxide semiconductor field effect transistor not fabricated in accordance with the invention (i.e., using a conventional ion implanted halo region).

FIG. 10 and FIG. 11 show a pair of graphs of electrical performance enhancement for a metal oxide semiconductor field effect transistor fabricated in accordance with the embodiment and the invention. FIG. 10 shows graphical data for threshold voltage roll-off (Vt Roll-off) performance as a function of gate length. FIG. 11 shows graphical data for drain induced barrier lowering DIBL performance as a function of gate length. The data that are illustrated within FIG. 10 and FIG. 11 are directed towards an n metal oxide semiconductor field effect transistor that is fabricated using generally conventional methods and material and that also include a gate length from 25 to 100 nanometers and a gate dielectric thickness of 1 nanometer. For comparison purposes, metal oxide semiconductor field effect transistors were fabricated using either an epitaxial halo region in accordance with the embodiment and the invention, or in an alternative a conventional ion implanted halo region.

FIG. 10 shows superior and higher threshold voltage roll-off values for a metal oxide semiconductor field effect transistor fabricated using an epitaxial halo region EHR in comparison with a conventional ion implanted halo region NEHR.

FIG. 11 shows superior and lower drain induced barrier lowering values for a metal oxide semiconductor field effect transistor fabricated using an epitaxial halo region EHR in comparison with a conventional ion implanted halo region NEHR.

The preferred embodiment is illustrative of the invention rather than limiting of the invention. Revisions and modifications may be made to methods, materials, structures and dimensions of a metal oxide semiconductor field effect transistor in accordance with the preferred embodiment while still providing a metal oxide semiconductor field effect transistor and a method for fabrication thereof in accordance with the invention, further in accordance with the accompanying claims.

What is claimed is:

1. A semiconductor structure comprising:
   a gate located over a gate dielectric, the gate dielectric in turn located over a channel region within a semiconductor substrate that separates a plurality of source regions and drain regions within the semiconductor substrate; and
   at least one halo region located at least in-part beneath the channel region and physically separated from the gate dielectric, wherein the at least one halo region comprises two counter-opposed halo regions each having a triangular shape defined at least in-part by a crystallographic plane of the semiconductor substrate.

2. The semiconductor structure of claim 1 wherein the semiconductor substrate comprises a bulk semiconductor substrate.

3. The semiconductor structure of claim 1 wherein the semiconductor substrate comprises a semiconductor-on-insulator substrate.

4. The semiconductor structure of claim 1 wherein:
   the semiconductor structure comprises a p-MOSFET;
   the semiconductor substrate comprises at least in-part a silicon semiconductor material;
   the channel region comprises at least in-part a silicon-germanium alloy semiconductor material;
   the plurality of source regions and drain regions comprises at least in-part a silicon-germanium alloy semiconductor material; and
   the at least one halo region comprises at least in-part a silicon-germanium alloy semiconductor material.

5. The semiconductor structure of claim 1 wherein:
   the semiconductor structure comprises an n-MOSFET;
   the semiconductor substrate comprises at least in-part a silicon semiconductor material;
   the channel region comprises at least in-part a silicon-germanium alloy semiconductor material;
   the plurality of source regions and drain regions comprises at least in part a silicon-carbon alloy semiconductor material; and
   the at least one halo region comprises at least in-part a silicon-carbon alloy semiconductor material.

6. A semiconductor structure comprising:
   a gate located over a gate dielectric, the gate dielectric in turn located over a channel region within a semiconductor substrate that separates a plurality of source regions and drain regions within the semiconductor substrate; and
   at least one halo region located at least in-part beneath the channel region and physically separated from the gate dielectric, wherein the semiconductor substrate comprises at least in-part a silicon semiconductor material, the channel region comprises at least in-part a silicon-germanium alloy semiconductor material, the plurality of source regions and drain regions comprises at least in-part a silicon-germanium alloy semiconductor material, and the at least one halo region comprises at least in-part a silicon-germanium alloy semiconductor material.

7. The semiconductor structure of claim 6 wherein the semiconductor substrate comprises a bulk semiconductor substrate.

8. The semiconductor structure of claim 6 wherein the semiconductor substrate comprises a semiconductor-on-insulator substrate.

9. The semiconductor structure of claim 6 wherein the at least one halo region comprises a single halo region comprising a bow-tie shape.

10. The semiconductor structure of claim 6 wherein the at least one halo region comprises two counter-opposed halo regions each having a triangular shape defined at least in-part by a crystallographic plane of the semiconductor substrate.

11. A semiconductor structure comprising:
    a gate located over a gate dielectric, the gate dielectric in turn located over a channel region within a semiconductor substrate that separates a plurality of source regions and drain regions within the semiconductor substrate; and
    at least one halo region located at least in-part beneath the channel region and physically separated from the gate dielectric, wherein the semiconductor substrate comprises at least in-part a silicon semiconductor material, the channel region comprises at least in-part a silicon-germanium alloy semiconductor material, the plurality of source regions and drain regions comprises at least in part a silicon-carbon alloy semiconductor material, and the at least one halo region comprises at least in-part a silicon-carbon alloy semiconductor material.

12. The semiconductor structure of claim 11 wherein the semiconductor substrate comprises a bulk semiconductor substrate.

13. The semiconductor structure of claim 11 wherein the semiconductor substrate comprises a semiconductor-on-insulator substrate.

14. The semiconductor structure of claim 11 wherein the at least one halo region comprises a single halo region comprising a bow-tie shape.

15. The semiconductor structure of claim 11 wherein the at least one halo region comprises two counter-opposed halo regions each having a triangular shape defined at least in-part by a crystallographic plane of the semiconductor substrate.

* * * * *